United States Patent
Lee et al.

(10) Patent No.: US 11,404,477 B2
(45) Date of Patent: Aug. 2, 2022

(54) MEMORY ARRAY AND METHOD OF FORMING THEREOF

(71) Applicant: TAIWAN SEMICONDUCTOR MANUFACTURING COMPANY LTD., Hsinchu (TW)

(72) Inventors: I-Che Lee, Hsinchu (TW); Huai-Ying Huang, Taipei County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/008,032

(22) Filed: Aug. 31, 2020

(65) Prior Publication Data

US 2022/0069010 A1    Mar. 3, 2022

(51) Int. Cl.
*H01L 27/22* (2006.01)
*H01L 43/12* (2006.01)
*H01L 43/02* (2006.01)
*H01L 29/78* (2006.01)

(52) U.S. Cl.
CPC ........ *H01L 27/228* (2013.01); *H01L 29/7851* (2013.01); *H01L 43/02* (2013.01); *H01L 43/12* (2013.01)

(58) Field of Classification Search
CPC ... H01L 27/228; H01L 29/7851; H01L 43/02; H01L 43/12
USPC ....................................................... 257/427
See application file for complete search history.

(56) References Cited

U.S. PATENT DOCUMENTS

2020/0091162 A1 *   3/2020   Morris ................ G11C 11/2257

* cited by examiner

*Primary Examiner* — Tu-Tu V Ho
(74) *Attorney, Agent, or Firm* — WPAT, P.C., Intellectual Property Attorneys; Anthony King

(57) ABSTRACT

A memory array and a method for forming the memory array are disclosed. The memory array includes memory elements, selectors and conductive vias. Each selector includes two pairs of fin structures and a gate structure. The gate structure crosses the two pairs of fin structures. The conductive vias are electrically coupled to the two pairs of fin structures of the selectors.

20 Claims, 15 Drawing Sheets

MEMORY ARRAY AND METHOD OF FORMING THEREOF

BACKGROUND

Electronic equipment involving semiconductor devices is essential for many modern applications. Technological advances in materials and design have produced generations of semiconductor devices, in which each generation includes smaller and more complex circuits than the previous generation. The semiconductor integrated circuit (IC) industry has produced a wide variety of digital devices to address issues in a number of different areas. Some of these digital devices, such as memory arrays, are configured for the storage of data. However, with the continuous shrinking of memory devices, fabrication processes continue to become more difficult to perform and new challenges are being discovered.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
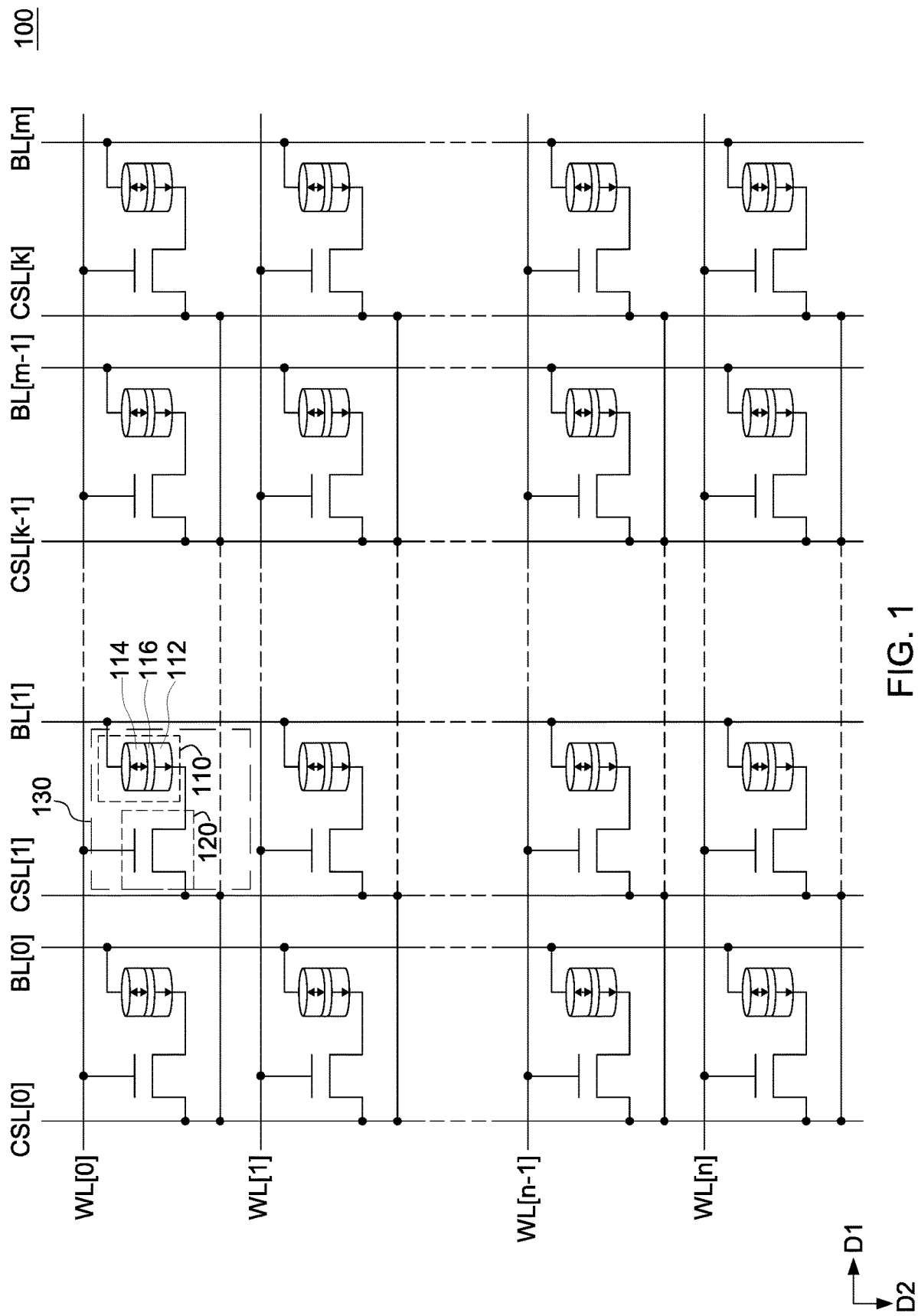
FIG. 1 is a schematic diagram illustrating a memory array, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of various patterns in one or more layers and may be expressed as unions of polygons. A design layout may be initially constructed by an array of identical or different standard cells during the layout design stage. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor circuit manufacturers or designers. Throughout the present disclosure, the standard cells are designed for implementing electronic circuits formed by semiconductor devices, e.g., a metal-oxide-semiconductor (MOS) device, and can be a planar field-effect transistor (FET) device, a fin-type FET (FinFET) device, a gate-all-around (GAA) device, a nanowire device, a fully-depleted silicon-on-isolator (FDSOI) device, or the like. In some embodiments, the standard cells include an interconnected structure of metal lines and metal vias arranged over a transistor, in which the metal lines and metal vias are interconnected to convey power and signals for the underlying transistor. In some embodiments, the standard cells are included in a standard cell library, which may be stored in a non-transitory computer-readable storage medium and accessed by a processor in a layout operation.

A semiconductor memory, such as a magnetic random-access memory (MRAM), may include an array of densely-packed MRAM units. In each MRAM unit, a data-storage element, such as a magnetic tunneling junction (MTJ) element, may be integrated with a transistor to perform write and read operations. With the continuous shrinking of semiconductor devices, there is a desire in reducing the layout area of the MRAM units. However, the MRAM units suffer from worse write performance due to low driving current of the shrinking sizes of transistors. Moreover, the bit error rate increases as the driving current decreases. Therefore, it may be desirable to have a memory array and a method to increase the driving current and reduce the layout area.

FIG. 1 is a schematic diagram illustrating a memory array, in accordance with some embodiments of the present disclosure. Referring to FIG. 1, the memory array 100 includes memory elements 110 and selectors 120. In some embodiments, the memory array 100 includes memory units 130, in which each memory unit 130 includes one selector 120 and one memory element 110. In some embodiments, the memory unit 130 may be an MRAM unit. The memory element 110 may be a data-storage element, such as a MTJ element or other types of memory elements, such as a resistive switching element. In some embodiments, the selectors 120 are configured to access the corresponding memory elements 110. The selectors 120 can be transistors, such as a planar field-effect transistor (FET) device, a fin-type FET (FinFET) device, a gate-all-around (GAA) device, a nanowire device, a fully-depleted silicon-on-isolator (FDSOI) device, or the like.

In some embodiments, the memory element 110 further includes a reference layer 112, a free layer 114 and a tunnel barrier layer (TBL) 116. The reference layer 112 and the free layer 114 are separated by the TBL 116. The reference layer 112 has a fixed magnetization direction, while the free layer 114 has a variable magnetization direction. If the magnetization directions of the reference layer 112 and the free layer 114 are in a parallel orientation (a parallel state), it is easier for conduction electrons to tunnel through the TBL 116, such that the MTJ element is in a low-resistance state. Conversely, if the magnetization directions of the reference layer 112 and the free layer 114 are in an antiparallel orientation (an antiparallel state), it is more difficult for conduction electrons to tunnel through the TBL 116, such that the MTJ element 116 is in a high-resistance state.

The memory array 100 further includes bit lines BL, word lines WL and common source lines CSL. The bit lines BL are labeled BL[0] through BL[m] in a first direction D1, the word lines are labeled WL[0] through WL[n] in a second direction D2 and the common source lines CSL are labeled CSL[0] through CSL[k] in the first direction D1. The second direction D2 is perpendicular to the first direction D1. The bit line BL is electrically coupled to one end of the corresponding memory element 110. In some embodiments, the bit line BL is coupled to one end of the memory element 110 through a top electrode under a metal wire (not shown). The common source line CSL is coupled to an opposite end of the corresponding memory element 110 through the corresponding selector 120. In some embodiments, a single common source line CSL is coupled to a number of selectors 120 in the second direction D2. In some embodiments, application of a suitable word line WL voltage to the gate structure of the selector 120 controls the flow of electrons (or electron holes) of the memory element 110 between the bit line BL and the common source line CSL. Consequently, by providing suitable biasing conditions, the memory element 110 can be switched between two states of electrical resistance, a first state with a low resistance (wherein magnetization directions of the free layer 114 and the reference layer 112 are parallel) and a second state with a high resistance (wherein magnetization directions of the free layer 114 and the reference layer 112 are antiparallel), to store data.

Figure 2:
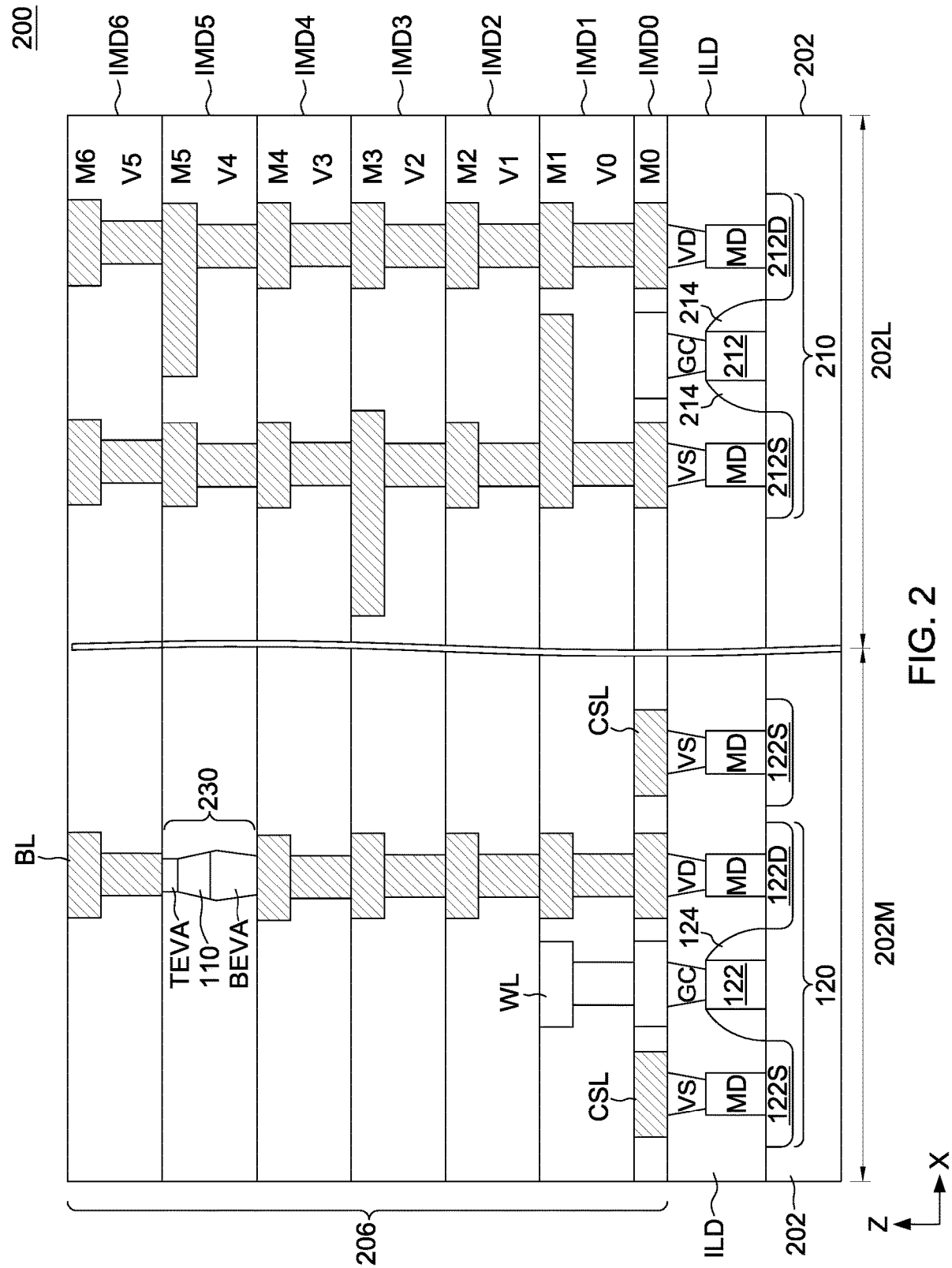
FIG. 2 is a schematic diagram illustrating a cross-sectional view of a semiconductor structure, in accordance with some embodiments of the present disclosure.

FIG. 2 is a schematic diagram illustrating a cross-sectional view of a semiconductor structure 200, in accordance with some embodiments of the present disclosure. The semiconductor structure 200 includes a substrate 202, an interlayer dielectric layer ILD and an interconnect structure 206. The substrate 202 may be formed of commonly-used semiconductor materials such as silicon (Si), silicon germanium (SiGe), gallium arsenide (GaAs), or the like, and may be a bulk substrate or a semiconductor-on-insulator (SOI) substrate. In some embodiments, the substrate 202 may include a plurality of functional regions. For example but not limited thereto, the substrate 202 can include a memory region 202M and a logic region 202L that are defined by isolation structures (not shown) and are electrically isolated from other functional regions by the isolation structures. The memory region 202M may include a plurality of the memory units 130 as shown in FIG. 1. The logic region 202L may include circuitry, such as a transistor 210, for processing information received from memory units (such as memory units 130) and for controlling reading and writing functions of the memory units 130. The transistor 210 in the logic region 202L can include a gate structure 212, source/drain regions 212S/212D, and spacers 214, but the disclosure is not limited thereto. In some embodiments, the selector 120 is disposed in the memory region 202M. The selector 120 in the memory region 202M can include a gate structure 122, source/drain regions 122S/122D, and spacers 124, but the disclosure is not limited thereto. For simplicity, components such as gate conductive layers and gate dielectric layers of the transistor 210 or the selector 120 that are commonly formed in integrated circuits are not illustrated herein.

Still referring to FIG. 2, the interlayer dielectric layer ILD is disposed over the substrate 202. In some embodiments, conductive line layers MD, source vias VS, drain vias VD and gate contact plugs GC are formed in the interlayer dielectric layer ILD.

The interconnect structure 206 is disposed over the interlayer dielectric layer ILD. In some embodiments, the interconnect structure 206 includes a plurality of conductive layers. For example, the interconnect structure 206 includes a plurality of metal layers Mn, e.g., M0 through M6, and a plurality of via layers Vn, e.g., V0 through V5, where n is a positive integer. The metal layers M0, M2 and M6 are extending in a same direction, parallel and overlaid with each other from a top-view perspective. The metal layers M1, M3 and M5 are extending in a same direction, parallel and overlaid with each other from a top-view perspective. The extending direction of the metal layers M0, 12 and M6 is perpendicular to the extending direction of the metal layers M1, M3 and M5. The via layers V0 through V5 electrically connect the metal layers M0, M2 and M6 to the metal layers M1, M3 and M5, respectively. For example, the via layer V0 electrically connects the metal layer M0 to the metal layer M1. In some embodiments, the metal layers M0 through M6 may be configured as or electrically connected to the common source line CSL, the bit line BL and the word line WL as shown in FIG. 1. In some embodiments, the metal layers M0 through M6 and the via layers V0 through V5 can include W, Al, Cu, AlCu, and the like.

Further, the metal layers M0 through M6 and the via layers V0 through V5 are disposed in a plurality of inter-metal dielectrics IMDn, e.g., IMD0 through IMD6. The inter-metal dielectrics IMD0 through IMD6 may provide electrical insulation as well as structural support for the various features during subsequent fabrication operations. In some embodiments, the inter-metal dielectrics IMD0 through IMD6 may be formed of low-K dielectric material, for example, material with k value lower than about 3.0, or even lower than about 2.5, but the disclosure is not limited thereto.

In some embodiments, the semiconductor structure 200 may include at least a semiconductor memory structure 230 embedded in the interconnect structure 206. The semiconductor memory structure 230 may include the memory element 110 as shown in FIG. 1. In some embodiments, the semiconductor memory structure 230 can be arranged in the metal layer M5 and encapsulated by the inter-metal dielectric layer IMD5, but the disclosure is not limited thereto. In other words, the semiconductor memory structure 230 can be arranged in any of the metal layers Mn and encapsulated by the inter-metal dielectrics IMDn, where n is a positive integer. In some embodiments, the semiconductor memory structure 230 is disposed in one of the inter-metal dielectrics IMDn and between two metal layers M(n−1) and M(n+1). For example, the semiconductor memory structure 230 can be disposed in the inter-metal dielectric IMD5, and further between the metal layer M6 and the metal layer M4.

Referring to FIG. 2, the memory element 110 is disposed between and coupled to a top electrode via TEVA and a bottom electrode via BEVA. In some embodiments, the memory element 110 is electrically connected to the connecting via V5 and the metal layer M6 by the top electrode via TEVA, and electrically connected to the metal layer M4 by the bottom electrode via BEVA. In some embodiments, a sum of a height of the connecting via Vn−1 and a height of the metal layer Mn in the inter-metal dielectric IMDn is substantially the same as a sum of a height of the memory element 110, a height of the top electrode via TEVA and a height of the bottom electrode via BEVA in the same inter-metal dielectric IMDn. For example, a sum of a height of the connecting via V4 and a height of the metal layer M5 in the inter-metal dielectric IMD5 is substantially the same as a sum of a height of the memory element 110, a height of the top electrode via TEVA and a height of the bottom electrode via BEVA in the inter-metal dielectric IMD5.

The conductive line layers MD, the source vias VS and the drain vias VD are formed in the interlayer dielectric layer ILD for providing electrical connections between other circuitry/elements and the source/drain regions 212S/212D of the transistor 210, and between other circuitry/elements and the source/drain regions 122S/122D of the selector 120. In some embodiments, the source vias VS are electrically connected to the conductive line layer MD. In some embodiments, the conductive line layer MD and the source via VS over the source region 122S electrically connect the source region 122S of the selector 120 to the common source line CSL in the metal layer M0. In some embodiments, the drain vias VD are electrically connected to the conductive line layer MD. The conductive line layer MD and the drain via VD over the drain region 122D electrically connects the drain region 122D of the selector 120 to the memory element 110 and the bit line BL in the metal layer M6.

In some embodiments, the gate contact plugs GC are formed in the interlayer dielectric ILD for providing electrical connections between other circuitry/elements and the gate structure 212 of the transistor 210, and between other circuitry/elements and the gate structure 122 of the selector 120. For example, the gate contact plug GC over the gate structure 122 electrically connects the gate structure 122 of the selector 120 to the word line WL in the metal layer M1. In some embodiments, the conductive line layer MD, the source vias VS, the drain vias VD and the gate contact plugs GC can include tungsten (W), but other suitable conductive materials such as silver (Ag), aluminum (Al), copper (Cu), AlCu, and the like may also be alternatively used or added. In some embodiments, an upper surface of the conductive line layer MD and an upper surface of the gate structures 212 or 122 are substantially on a same level.

Figure 3A:
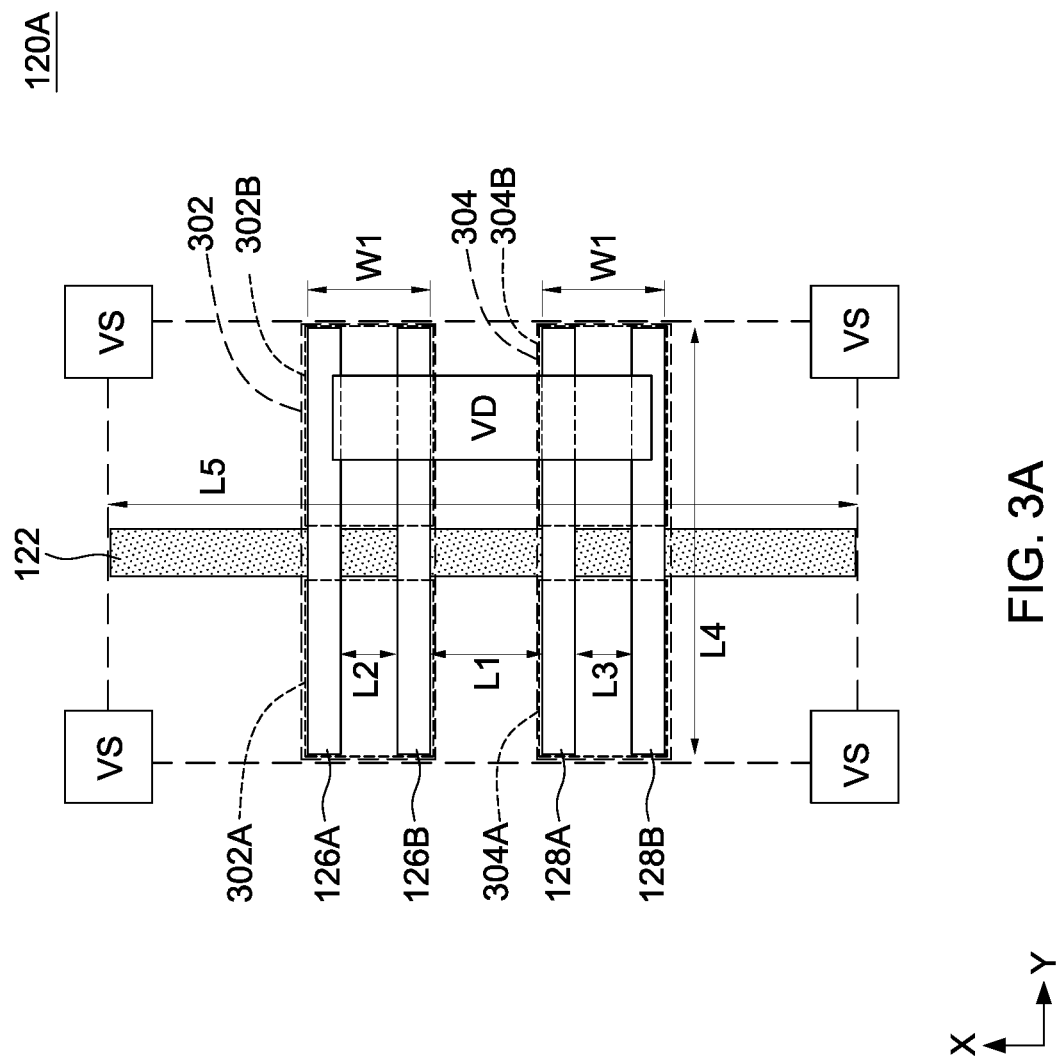
FIGS. 3A-3C are design layouts of cells for selectors, respectively, in accordance with some embodiments of the present disclosure.
Figure 3C:
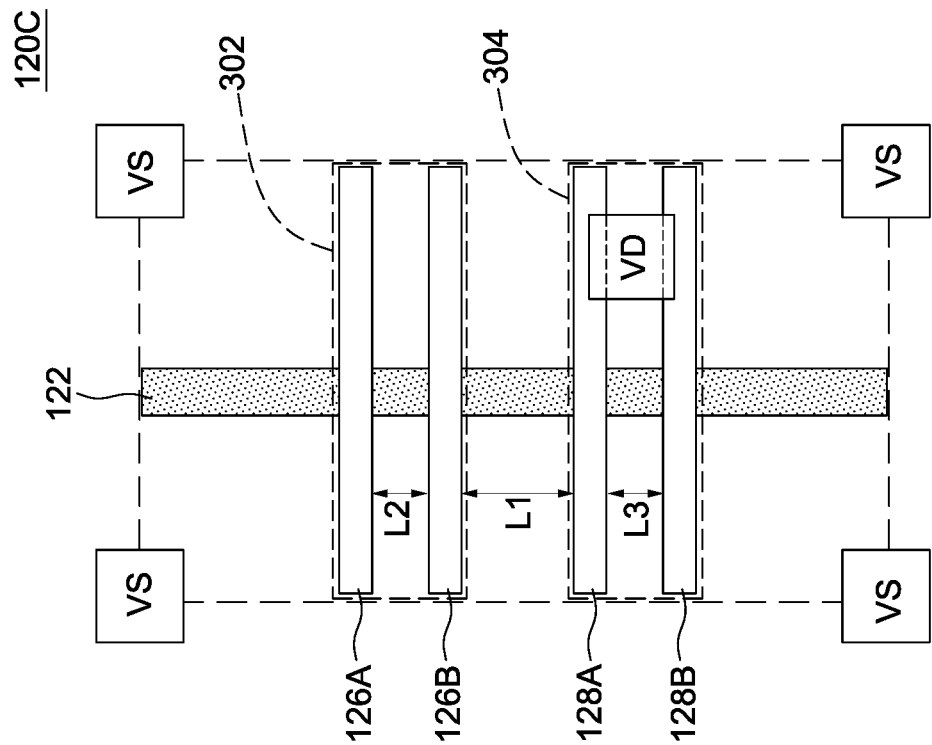
Figure 3B:
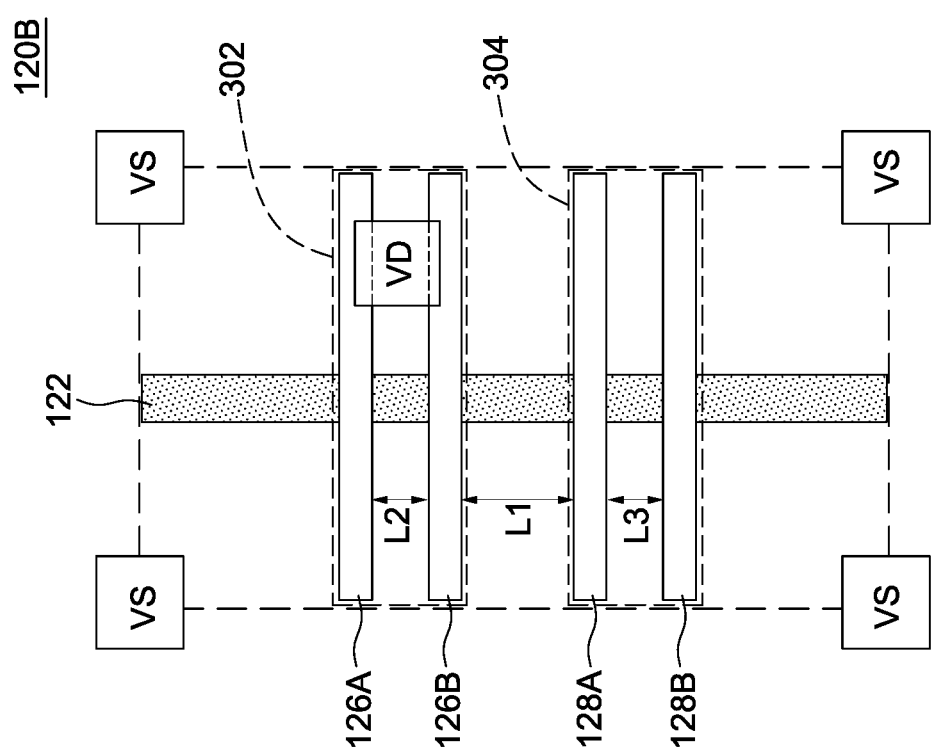

FIGS. 3A-3C are design layouts of cells for selectors 120A, 120B and 120C, respectively, in accordance with some embodiments of the present disclosure. Each of the selectors 120A, 120B and 120C are represented in a form of a cell, in which different layers are overlaid from a top-view perspective. Many aspects of the selectors 120A are similar to those of the selector 120 shown in FIGS. 1 and 2, and are hereby omitted from discussion for brevity.

Referring to FIG. 3A, the selector 120A includes two pairs of fin structures 126, 128 extending in the row direction along the x-axis. In some embodiments, the two pairs of fin structures 126, 128 include a pair of first fin structures 126A and 126B, and a pair of second fin structures 128A and 128B. In some embodiments, the first fin structures 126A, 126B and the second fin structures 128A, 128B extending in the row direction along the x-axis are disconnected in regions designed for different conductivity types. The selector 120A further includes a gate structure 122 extending in the column direction along the y-axis. In some embodiments, the gate structure 122 of the selector 120 crosses the two pairs of fin structures 126, 128. In some embodiments, the gate structure 122 crosses the first fin structures 126 and the second fin structures 128.

Referring to FIG. 3A, the selector 120A further includes two active regions (e.g., a first active region 302 and a second active region 304). The first active region 302 and the second active region 304 may be N-well active regions or P-well active regions. In some embodiments, the doping concentration of the first active region 302 and doping concentration of the second active region 304 are different. In some embodiments, the first active region 302 and the second active region 304 may be different types of active regions. In some embodiments, the first active region 302 and the second active region 304 are configured as the source/drain regions 122S/122D as shown in FIG. 2. For example, the first active region 302 and the second active region 304 define first areas 302A, 304A and second areas 302B, 304B on opposite sides of the gate structure 122. The first areas 302A and 304A may be configured as the source region 122D of the selector 120A. The second areas 302B and 304B may be configured as the drain region 122D of the selector 120A.

The pair of first fin structures 126 is disposed in the first active region 302, and the pair of second fin structures 128 is disposed in the second active region 304 from a top view perspective. In some embodiments, a spacing L1 between the two pairs of fin structures 126, 128 is greater than a spacing between the fins of the first fin structures 126 or between the fins of the second fin structures 128. For example, a spacing L2 between the first fin structures 126A and 126B or a spacing L3 between the second fin structures 128A and 128B is in a range between about 10 nanometers (nm) and about 30 nm, e.g., approximately 22 nm, but the disclosure is not limited thereto. In some embodiments, the spacing L2 and the spacing L3 may be different. In some embodiments, the spacing L1 is in a range between about 40 nm and about 60 nm, e.g., approximately 50 nanometers, but the disclosure is not limited thereto. If the spacing L2 or L3 is made greater than the spacing L1, the device area may be unduly increased. In some embodiments, a width W1 of the first active region 302 or a width W1 of the second active region 304 measured along the column direction along the y-axis is in a range between about 20 nm and about 40 nm, e.g., approximately 34 nanometers, but the disclosure is not limited thereto. In some embodiments, a width of the first fin structure 126 or a width of the second fin structure 128 measured along the column direction along the y-axis is in a range between about 1 nm and about 15 nm, e.g., approximately 6 nanometers, but the disclosure is not limited thereto.

In some embodiments, a length L4 of the two pairs of fin structures 126, 128 in the row direction along the x-axis is substantially less than a length L5 of the gate structure 122 in the column direction along the y-axis. In some embodiments, a ratio of the length L4 of the two pairs of fin structures 126, 128 in the row direction along the x-axis to the length L5 of the gate structure 122 in the column direction along the y-axis is substantially less than about one, less than about ½, or less than 0.4. If the ratio of the length L4 to the length L5 is greater than about one, the layout area of the cell of the selector 120A may be unduly increased without performance advantages. The ratio of the length L4 to the length L5 is arranged to be less than about 1, ½ or 0.4 so that the layout area of the cell of the selector 120A may be reduced while increasing the number of fin structures. In some embodiments, the length L4 of the fin structures 126, 128 in the row direction along the x-axis is in a range between about 40 nm and about 60 nm, e.g., approximately 51 nanometers, but the disclosure is not limited thereto. In some embodiments, the length L5 of the gate structure 122 in the column direction along the y-axis is in a range between about 120 nm and about 150 nm, e.g., approximately 134 nanometers, but the disclosure is not limited thereto. The length L4 of the two pairs of fin structure 126, 128 and the length L5 of the gate structure 122 defines the layout area of the cell of the selector 120A. The arrangement of the gate structure 122 and the two pairs of fin structures 126, 128 may reduce the layout area of the cell of the selector 120A as compared to existing layouts which adopt double-gate structures or dummy-gate structures.

In some embodiments, the spacing L1 between the two pairs of fin structures 126, 128 is greater than one half of the length L4 of the two pairs of fin structures 126, 128 in the row direction along the x-axis. If the spacing L1 is less than the length L4, the distance between two adjacent conductive vias (such as drain vias VD) may not be sufficient for reliable electrical insulation between the conductive vias. In some embodiments, the width W1 of each of the active region 302 or 304 is arranged to be greater than the length L4 or greater than one half of the length L4 so that the selector 120A may be able to accommodate more fin structures 126, 128 within the respective active regions 302, 304.

Still referring to FIG. 3A, a drain via VD is electrically coupled to the two pairs of fin structures 126, 128. In some embodiments, the drain via VD may be arranged on a side of the two pairs of fin structures 126, 128. In some embodiments, the drain via VD overlaps the pair of first fin structures 126A, 126B and the pair of second fin structures 128A, 128B from a top view perspective. In some embodiments, the drain via VD is electrically coupled to the drain regions 302B, 304B of the selector 120A.

Source vias VS are electrically coupled to the two pairs of fin structures 126, 128. In some embodiments, the source vias VS may be arranged at the corners of the selector 120A. In some embodiments, the source vias VS are arranged at the cell edges of the selector 120A and away from the corners of the cell. In some embodiments, a common source line (such as the common source line CSL in FIG. 1) extends across a row or a column of selectors and is electrically connected to the source vias VS in the same row or the same column.

Many aspects of the selectors 120B, 120C are similar to those of the selector 120A shown in FIG. 3A, and are hereby omitted from discussion for brevity. Referring to FIG. 3B, the drain via VD only overlaps the pair of first fin structures 126 from a top view perspective. Referring to FIG. 3C, the drain via VD only overlaps the pair of second fin structures 128 from a top view perspective.

Figure 4:
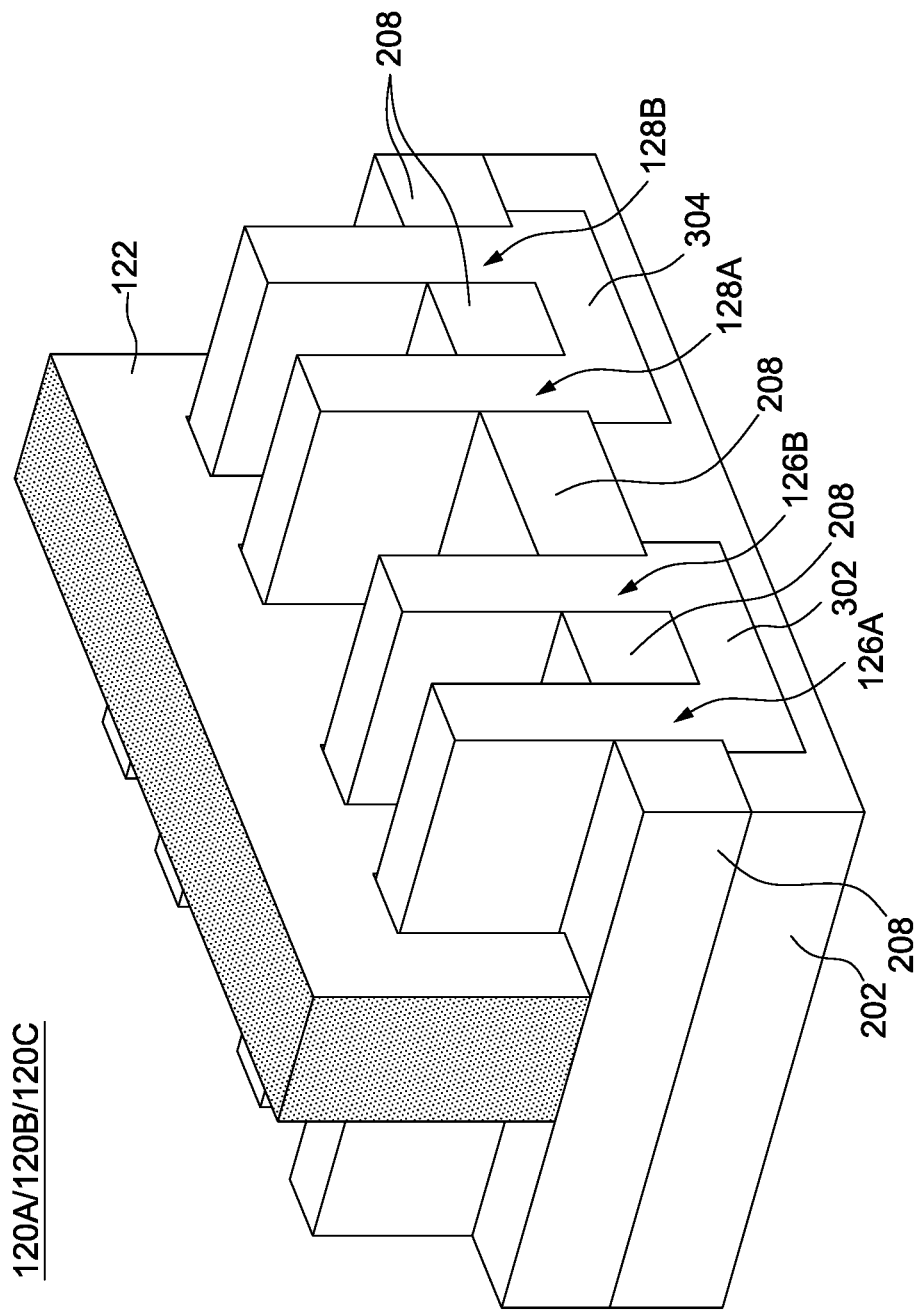
FIG. 4 is a schematic perspective view illustrating a semiconductor structure of a selector, in accordance with some embodiments of the present disclosure.

FIG. 4 is a schematic perspective view illustrating a semiconductor structure of the selectors 120A, 120B or 120C, in accordance with some embodiments of the present disclosure. Referring to FIG. 4, the substrate 202 has two active regions (e.g., the first active region 302 and the second active region 304). In some embodiments, the substrate 202 further has isolation structures (e.g., shallow trench isolation (STI) structures) 208 interposing the regions containing different conductivity types. In some embodiments, the first fin structures 126A, 126B and the second fin structures 128A, 128B are electrically isolated from each other by the isolation structures 208.

The two pairs of fin structures 126, 128 extend along the x-axis. The gate structure 122 extends along the y-axis. The gate structure 122 crosses the two pairs of fin structures 126, 128. In some embodiments, the gate structure 122 crossing the two pairs of fin structures 126, 128 defines two pairs of channel regions with the two pairs of fin structures 126, 128. For example, the gate structure 122 along with the first fin structures 126A, 126B and the second fin structures 128A, 128B defines a pair of channel regions for the first fin structures 126A, 126B and another pair of channel regions for the second fin structures 128A, 128B. The arrangement of the gate structure 122 of the selector 120 crossing the two pairs of fin structures may increase the number of channel regions up to four with respect to the fin structures 126, 128, and therefore driving current of the selector 120 is enlarged as compared to existing architectures which adopt single-fin or double-fin structures. Accordingly, the worse write performance caused by the low driving current can be mitigated.

In some embodiments, the gate structure 122 extending in the column direction along the y-axis are disconnected in regions designed for different conductivity types. For simplicity, components such as gate conductive layers and gate dielectric layers associated with the gate structure 122 are not illustrated in FIG. 4.

Figure 5A:
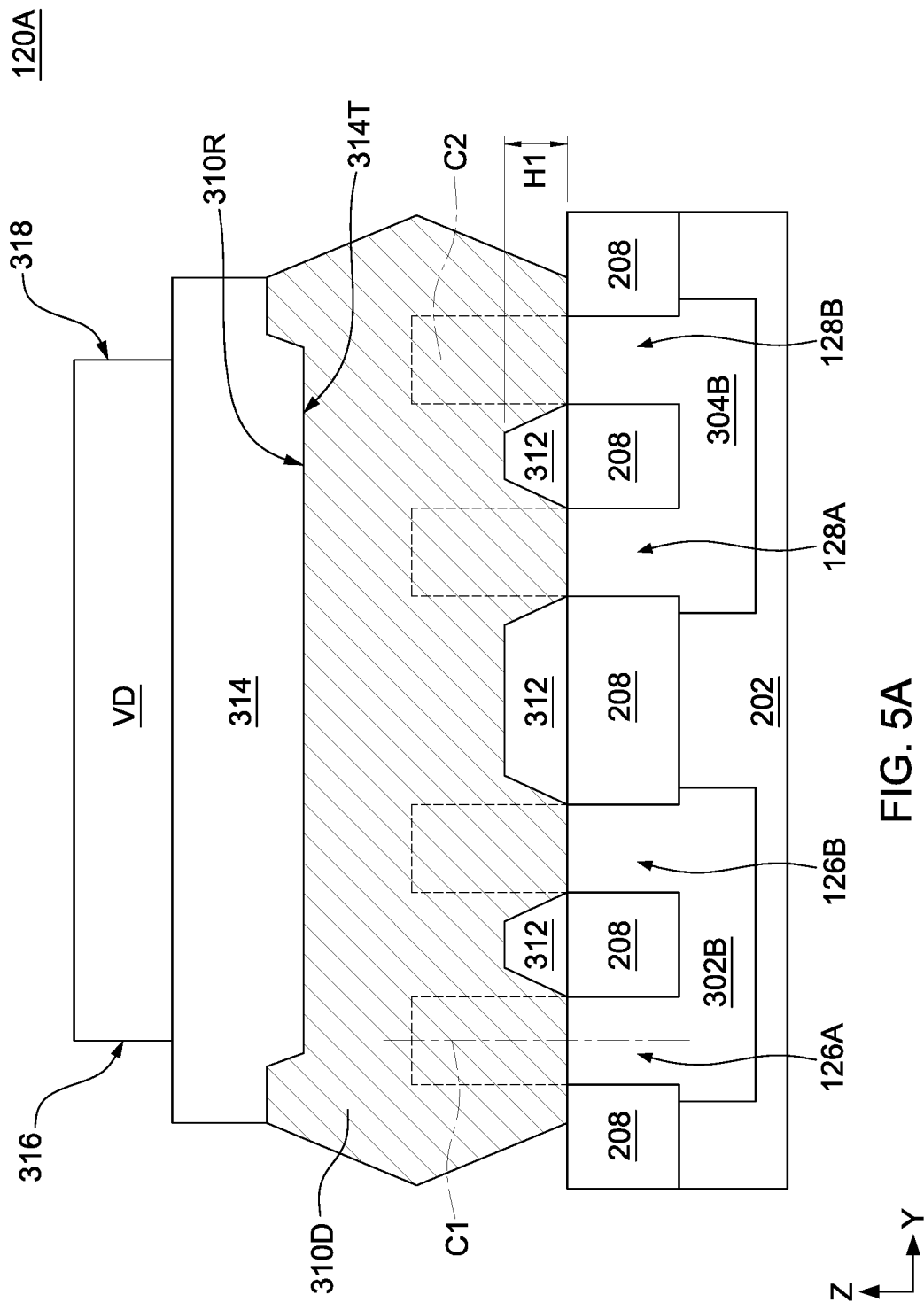
FIGS. 5A-5C are cross-sectional views of selectors, respectively, in accordance with some embodiments of the present disclosure.
Figure 5B:
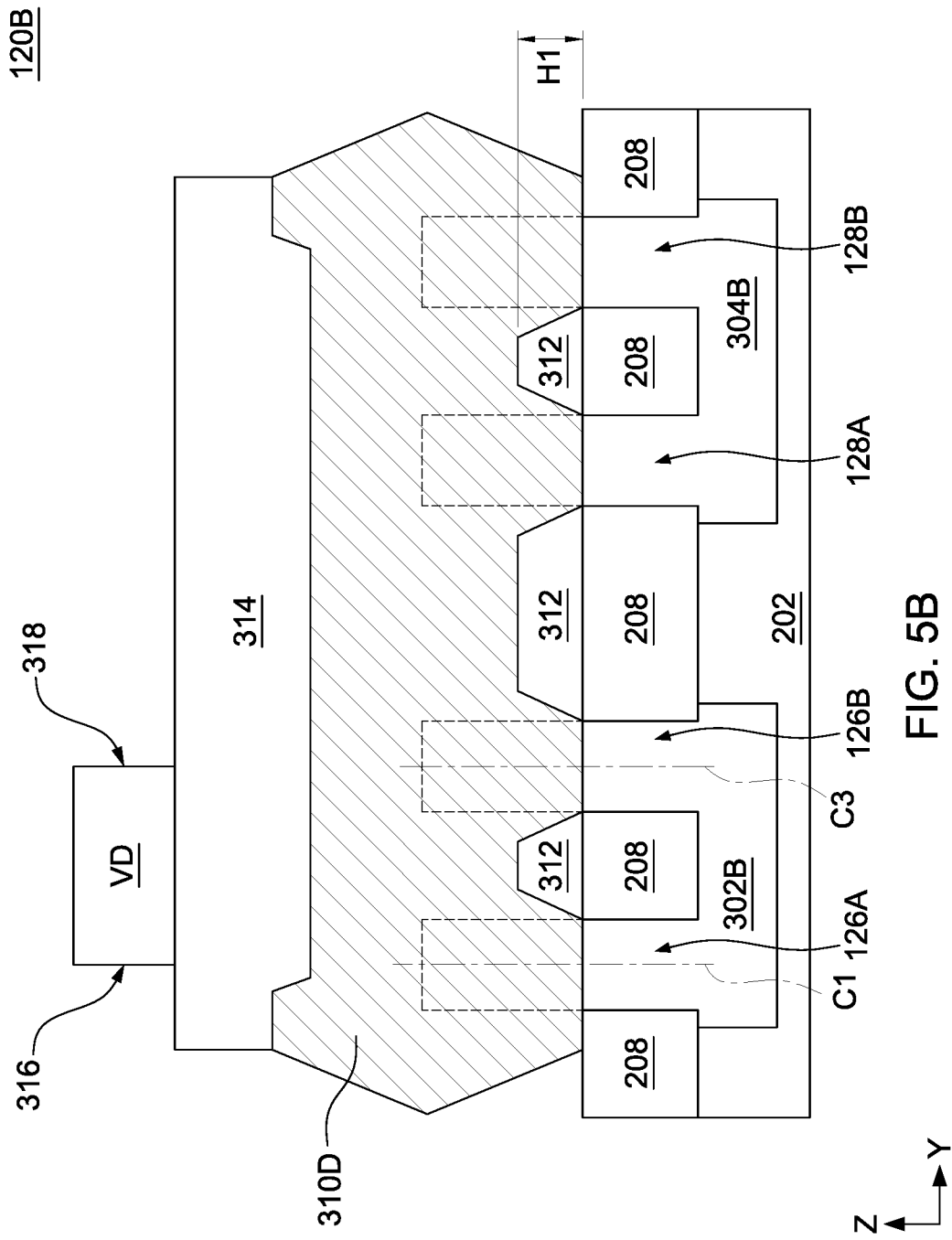
Figure 5C:
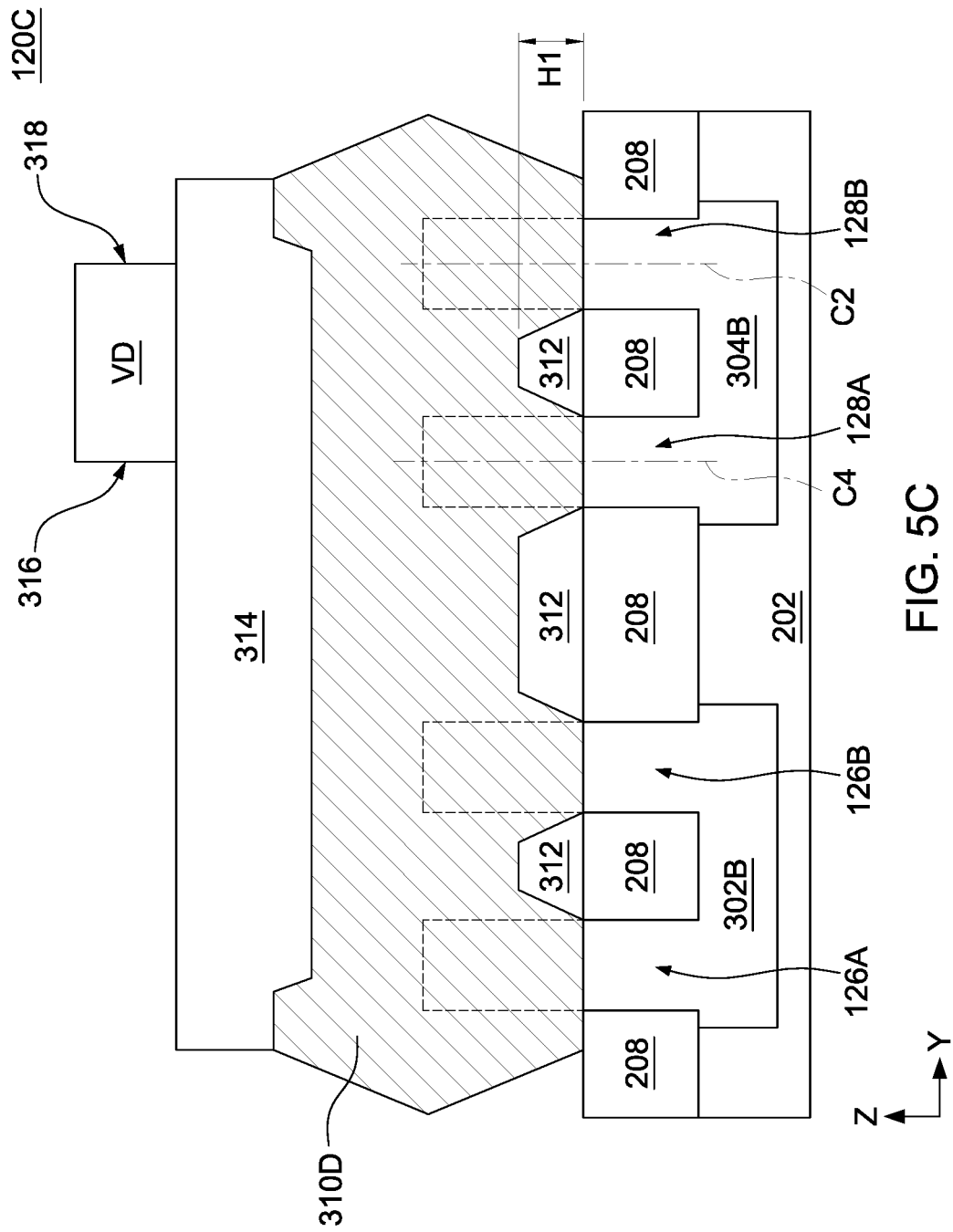

FIGS. 5A-5C are cross-sectional views of the selectors 120A, 120B and 120C, respectively, in accordance with some embodiments of the present disclosure. Referring to FIGS. 5A-5C, the two pairs of fin structures 126, 128 that are uncovered by the gate structure 122 are recessed (etched) down to the level substantially equal to the upper surface of the substrate 202. An epitaxial source/drain structure 310 may be formed over the first fin structures 126 and the second fin structures 128. The epitaxial source/drain structure 310 may be made of one or more layers of semiconductor material having a different lattice constant than the first fin structures 126 or the second fin structures 128. In some embodiments, when the first fin structures 126 or the second fin structures 128 are made of Si, the epitaxial source/drain structure 310 includes SiP, SiC or SiCP for an n-channel Fin FET and SiGe or Ge for a p-channel Fin FET.

As shown in FIG. 5A, an epitaxial drain structure 310D is formed over the drain regions 302B, 304B. The epitaxial drain structure 310D is epitaxially formed over the recessed portions of the first fin structures 126 and the second fin structures 128. In some embodiments, the epitaxial drain structure 310D may be configured as the drain of the selector 120A. In some embodiments, the epitaxial drain structure 310D has a diamond-like shape. In some embodiments, the epitaxial drain structure 310D has facets on two sides.

In some embodiments, a conductive line 314 is formed over the epitaxial drain structure 310D. The conductive line 314 can be the conductive line layer MD as shown in FIG. 1. In some embodiments, the conductive line 314 extends along the y-axis and electrically connects the two pairs of fin structures 126, 128. In some embodiments, the epitaxial drain structure 310D has a recessed surface 310R. In some embodiments, the conductive line 314 is formed over the recessed surface 310R of the epitaxial drain structure 310D. In some embodiments, the recessed surface 310R is notched in the epitaxial drain structure 310D along the z-axis. In some embodiments, the conductive line 314 includes a tapering surface 314T engaged with the recessed surface 310R of the epitaxial drain structure 310D. In some embodiments, the conductive line 314 includes a protrusion protruding downwardly into the epitaxial drain structure 310D. In some embodiments, the arrangement of the epitaxial drain structure 310D and the conductive line 314 provides better electrical connection and lower resistance between the epitaxial drain structure 310D and the conductive line 314.

In some embodiments, a void or a gap (an air gap) 312 is formed in a lower portion of the epitaxial drain structure 310D. In some embodiments, the void 312 is formed between adjacent fin structures (such as between the first fin structures 126A, 126B, between the first fin structure 126B and second fin structure 128A, or between the second fin structures 128A, 128B). In some embodiments, a height HI of the void 312 is in a range from about 10 nm to about 30 nm measured from an upper surface of isolation structure 208, and in a range from about 15 nm to about 25 nm in other embodiments.

Referring to FIGS. 3A and 5A, the drain via VD of the selector 120A is disposed over the conductive line 314. In some embodiments, the drain via VD overlaps the first fin structures 126A, 126B and the second fin structures 128A, 128B from a top view. In some embodiments, the drain via VD extending along the y-axis crosses the two pair of fin structures 126, 128 from a top view. In some embodiments, a sidewall 316 of the drain via VD is aligned with a center line C1 of the first fin structure 126A. In some embodiments, another sidewall 318 of the drain via VD is aligned with a center line C2 of the second tin structure 128B. In some embodiments, the extended drain via VD provides a better electrical connection and lower resistance between the drain via VD and the conductive line 314.

Referring to FIGS. 3B and 5B, the drain via VD in the selector 120B is disposed over the conductive line 314. In some embodiments, the drain via VD only overlaps the first fin structures 126A, 126B from a top view. In some embodiments, the sidewall 316 of the drain via VD is aligned with the center line C1 of the first fin structure 126A, and the sidewall 318 of the drain via VD is aligned with the center line C3 of the first fin structure 126B. In some embodiments, a vertical projection area of the drain via VD is within the area of the first active region 302. In some embodiments, the vertical projection area of the drain via VD is within the drain region 302B. In some embodiments, the smaller size of the drain via VD may reduce the shorting issues caused by the adjacent drain vias VD.

Referring to FIGS. 3C and 5C, the drain via VD in the selector 120C is disposed over the conductive line 314. In some embodiments, the drain via VD only overlaps the second fin structures 128A, 128B from a top view. In some embodiments, the sidewall 316 of the drain via VD is aligned with the center line C4 of the second fin structure 128A, and the sidewall 318 of the drain via VD is aligned with the center line C2 of the second fin structure 128B. In some embodiments, a vertical projection area of the drain via VD is within the area of the second active region 304. In some embodiments, the vertical projection area of the drain via VD is within the drain region 304B. In some embodiments, the smaller size of the drain via VD may reduce the shorting issues caused by the adjacent drain vias VD.

The structures and layouts of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6A:
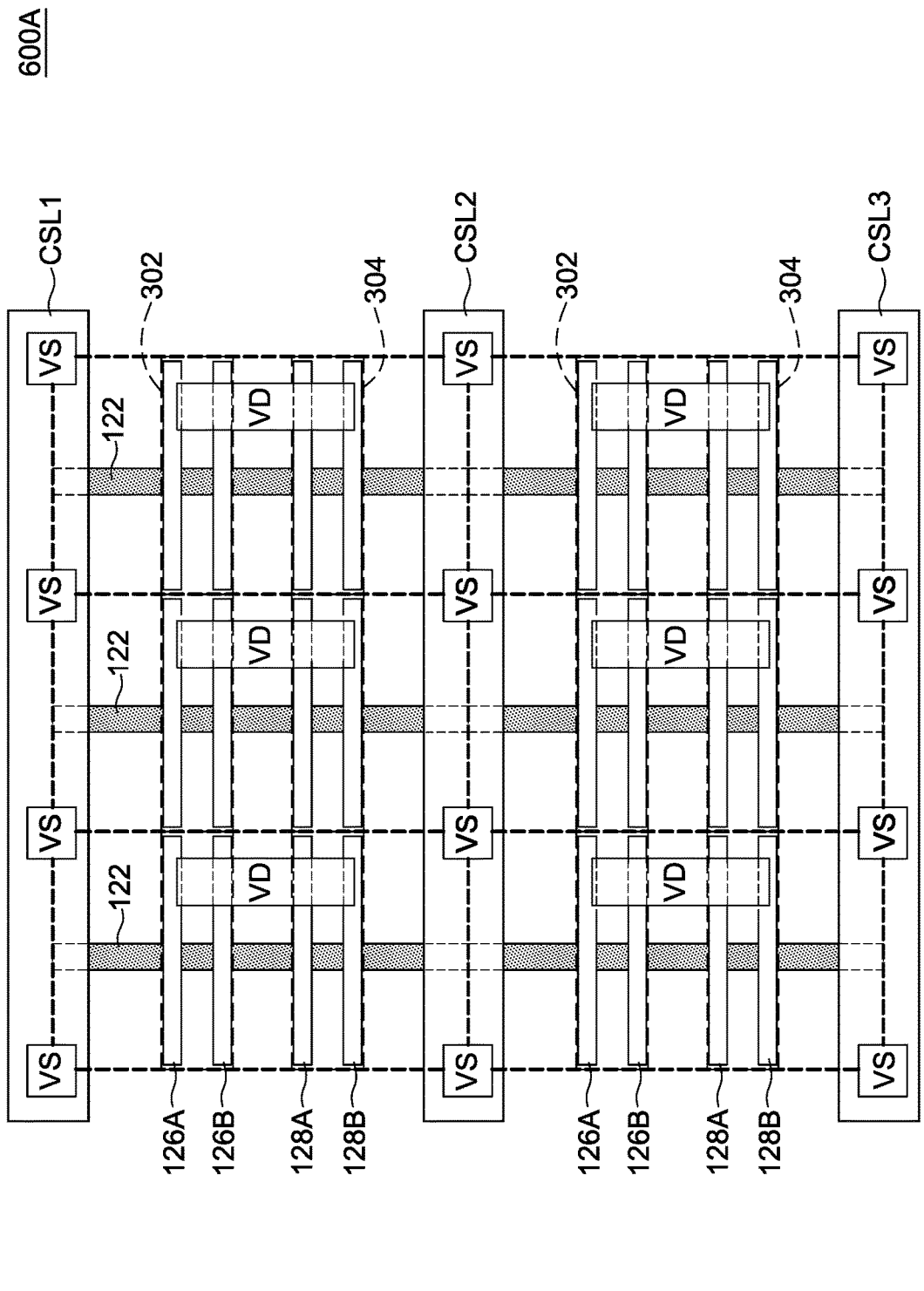
FIGS. 6A-6C are design layouts, in accordance with some embodiments of the present disclosure.

FIG. 6A is a design layout 600A, in accordance with some embodiments of the present disclosure. Referring to FIG. 6A, the design layout 600A includes a plurality of selectors 120A. The source vias VS are arranged at the corners between the adjacent selectors 120A. The source vias VS are arranged at the corners of the selectors 120A. The source vias VS are arranged on boundary lines between the selectors 120A. The source vias VS are arranged on boundary lines between different selectors 120A. The neighboring selectors 120A share the source vias VS between each other. In some embodiments, a source via VS is surrounded and shared by four selectors 120A. The source via VS is electrically coupled to the surrounding selectors 120A. In some embodiments, the source vias VS in a same row or column are electrically coupled to a same common source line CSL shown in FIG. 1. The common source line CSL may extend along the boundary lines between the selectors 120A. In some embodiments, the source vias VS in a different row or column are electrically coupled to different common source lines CSL1, CSL2 and CSL3. For example, the source vias VS in a first row are electrically coupled to a first common source line CSL1, and the source vias VS in a second row are electrically coupled to a second common source line CSL2. The first common source line CSL1 and the second common source line CSL2 are parallel to each other.

Still referring to FIG. 6A, the drain vias VD in different selectors 120A are aligned. For example, the drain vias VD in a same row are aligned, and the drain vias VD in a same column are aligned. The drain vias VD in different selectors 120A may be arranged on a same side of the respective gate structure 122. The drain vias VD are arranged to comply with a design rule of the conductive vias (such as a distance between the source vias VS and the drain vias VD). For example, the drain via VD in a first selector 120A is disposed on the right side of the gate structure 122 in each selector 120A, while another drain via VD in a second selector 120A neighboring to the first selector 120A is also disposed on the right side of the gate structure 122.

In some embodiments, the first fin structures 126A, 126B and the second fin structures 128A, 128B extending in the row direction along the x-axis are disconnected at the boundary lines between the selectors 120A. In some embodiments, the design layout 600A further includes cell-edge gate structures (not shown) parallel to the gate structures 122 and disposed at the boundary lines between the selectors 120A. The cell-edge gate structures may be formed of a conductive material substantially same as the gate structure 122, however, the cell-edge gate structures are not functioning in forming a transistor. The first fin structures 126A, 126B and the second fin structures 128A, 128B extending in the row direction along the x-axis may be separated by the cell-edge gate structures at the boundary lines between the selectors 120A. In some embodiments, the first fin structures 126A, 126B and the second fin structures 128A, 128B extend continually in the row direction along the x-axis and cross the boundary lines between the selectors 120A.

Figure 6B:
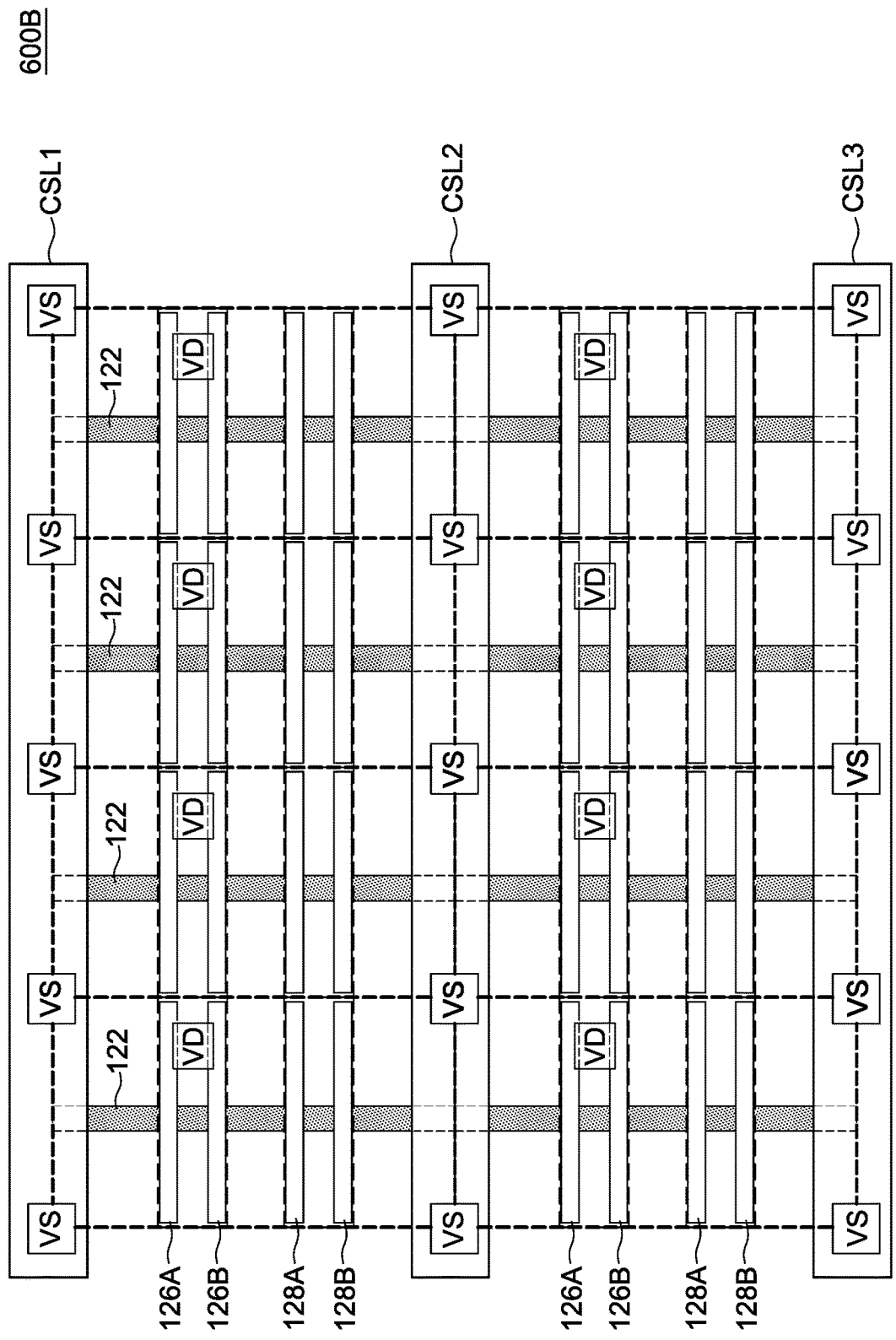
Figure 6C:
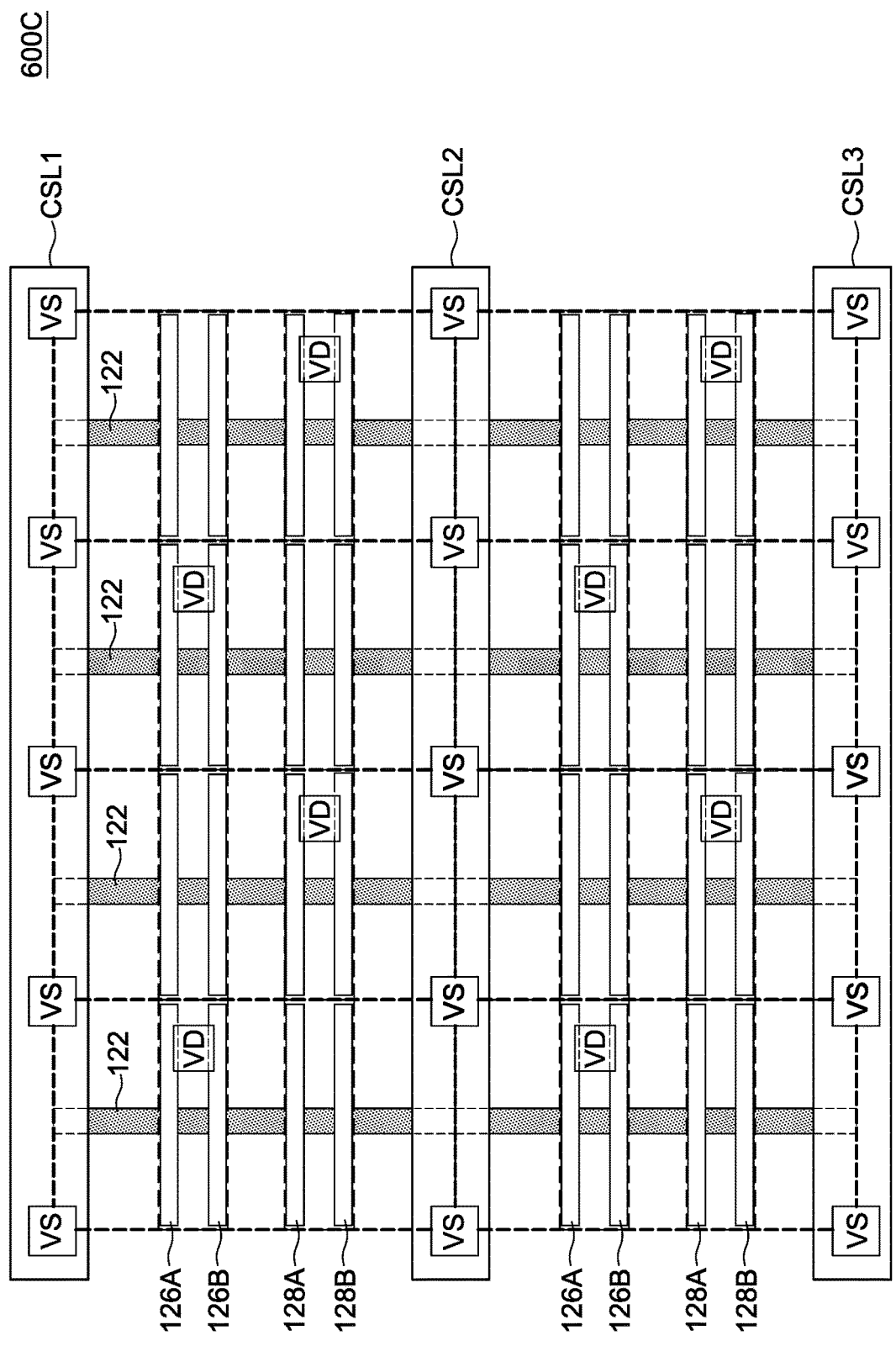

FIGS. 6B-6C are design layouts 600B, 600C, in accordance with some embodiments of the present disclosure. Many aspects of the design layout 600B and 600C are similar to those of the design layout 600A, and are hereby omitted from discussion for brevity.

Referring to FIG. 6B, the design layout 600B includes a plurality of selectors 120B. In some embodiments, the drain vias VD in different selectors 120B are aligned in the row and column directions. For example, the drain vias VD in a same row are aligned, and the drain vias VD in a same column are aligned. The drain vias VD in different selectors 120B overlap the pair of the first fin structures 126. The drain vias VD may be arranged on a same side of the respective the gate structure 122 in each selector 120B. For example, the drain via VD in a selector 120B is disposed on the right side of the respective gate structure 122.

Referring to FIG. 6C, the design layout 600C includes a plurality of selectors 120B and a plurality of selectors 120C. The selectors 120B and the selectors 120C may be arranged alternatingly. For example, a selector 120C is between two selectors 120B in the row direction along the x-axis. In some embodiments, two adjacent selectors 120B are separated by the selector 120C in the row direction. In some embodiments, the selector 120B is adjacent to another selector 120B in the column direction. In alternative embodiments, the selector 120C is further arranged between two selectors 120B in the column direction. In some embodiments, the selector 120C is surrounded by the selectors 120B in the row and the column direction. In some embodiments, the selector 120B is also surrounded by the selectors 120C in the row and the column direction.

In some embodiments, the drain vias VD in the design layout 600C may be classified into a first subset and a second subset. The first subset of the drain vias VD overlaps the first fin structures 126 from a top view. The second subset of the drain vias VD overlaps the second fin structures 128 from the top view. The first subset of the drain vias VD and the second subset of the drain vias VD form a staggered pattern in the row direction along the x-axis. In some embodiments, two adjacent drain vias VD are offset from each other in the second direction D2. For example, the drain via VD of the selector 120B and the drain via VD of the selector 120C are not aligned. The drain via VD of the selector 120B and the drain via VD of the selector 120C in a same row are spaced from each other in the second direction D2. In some embodiments, the first subset of the drain vias VD in the same column is aligned in the column direction. The second subset of the drain vias VD in a same column may be aligned in the column direction. In some embodiments, the first subset of the drain vias VD and the second subset of the drain vias VD may be arranged on a same side of the respective gate structure 122 in each selectors 120B or 120C. For example, the drain via VD in the selector 120B is disposed on the right side of the respective gate structure 122. In some embodiments, the drain via VD in the selector 120C is also disposed on the right side of the respective gate structure 122.

Figure 7:
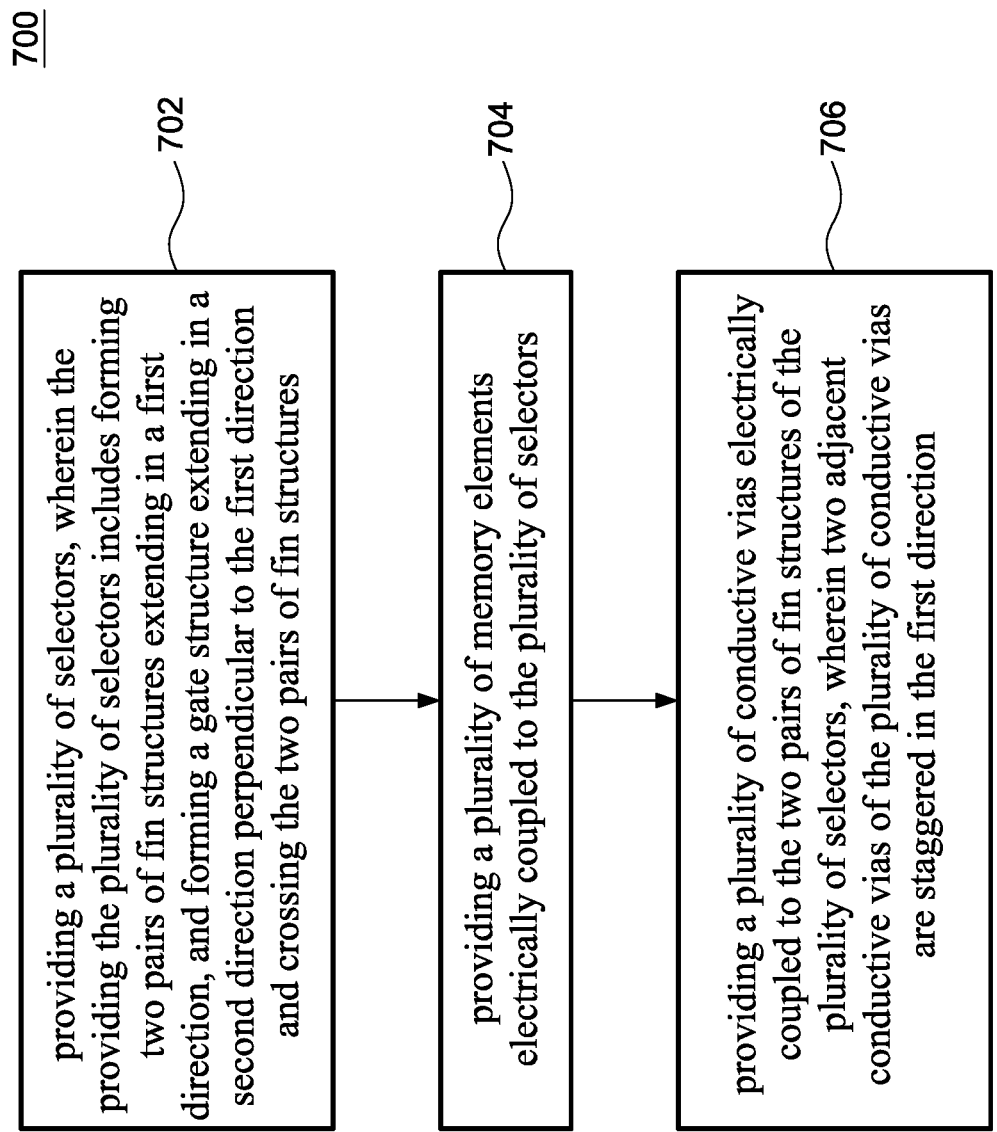
FIG. 7 is a flowchart of representing a method for forming a memory array, in accordance with some embodiments of the present disclosure.

FIG. 7 is a flowchart of representing a method for forming a memory array, in accordance with some embodiments of the present disclosure. The method for forming a memory array 700 includes an operation 702 where a plurality of selectors is provided. In some embodiments, the providing the plurality of selectors includes forming two pairs of fin structures extending in a first direction. In some embodiments, the providing the plurality of selectors further includes forming a gate structure extending in a second direction perpendicular to the first direction and crossing the two pairs of fin structures. In some embodiments, the providing the plurality of selectors further includes forming first and second active regions. In some embodiments, the two pairs of fin structures are formed in the first and second active regions, respectively. In some embodiments, a ratio of a length of the two pairs of fin structures in the first direction to a length of the gate structure in the second direction is substantially less than about one. The method 10 further includes an operation 704 where a plurality of memory elements are provided and electrically coupled to the plurality of selectors. The method 10 further includes an operation 706 where a plurality of conductive vias are provided and electrically coupled to the two pairs of fin structures of the plurality of selectors. In some embodiments, two adjacent conductive vias of the plurality of conductive vias are staggered in the first direction.

Figure 8:
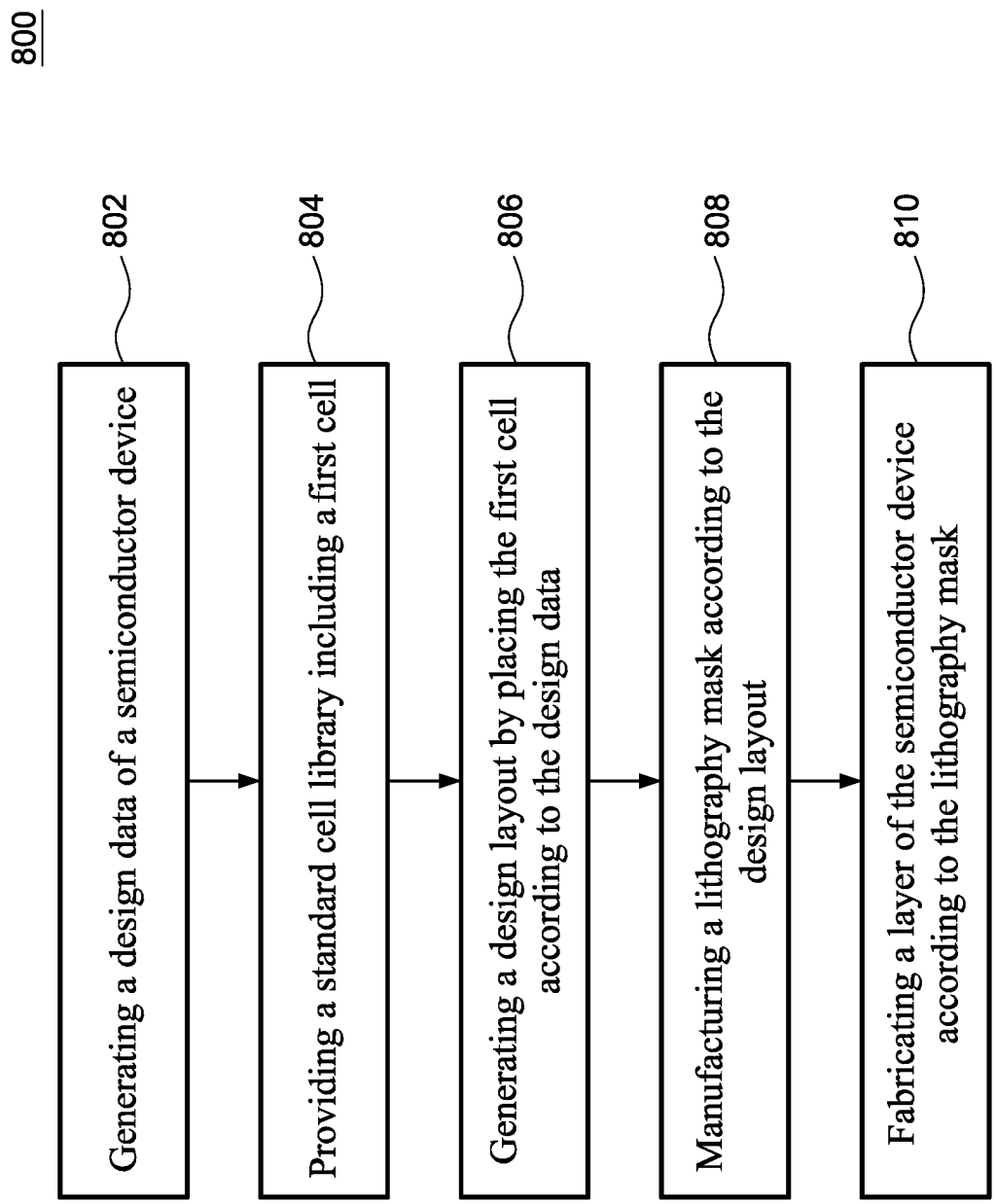
FIG. 8 is a flowchart of a layout method, in accordance with some embodiments of the present disclosure.

FIG. 8 is a flowchart of a layout method, in accordance with some embodiments of the present disclosure. At step 802, a design data of a semiconductor device is generated or received. The design data may be represented as a netlist, a schematic diagram, a circuit diagram or the like. In some embodiments, the semiconductor device includes at least one aforementioned selector, such as the selector 120A, 120B or 120C. In some embodiments, the design data in step 802 is generated during a synthesis stage of a design flow for manufacturing the semiconductor device.

At step 804, a standard cell library is provided which includes a first cell. In some embodiments, the first cell is a selector. The descriptions of the selector are discussed previously and are not repeated for brevity.

At step 806, a design layout is generated by at least one of the first cell according to the design data. The step 806 may be performed during a placement and routing stage of a design flow for manufacturing a semiconductor device.

At step 808, a lithography mask is manufactured according to the design layout. At step 810, a semiconductor device fabricated in which a layer of the semiconductor device is formed according to the lithography mask. In some embodiments, the semiconductor device is fabricated according to the design layout.

Figure 9A:
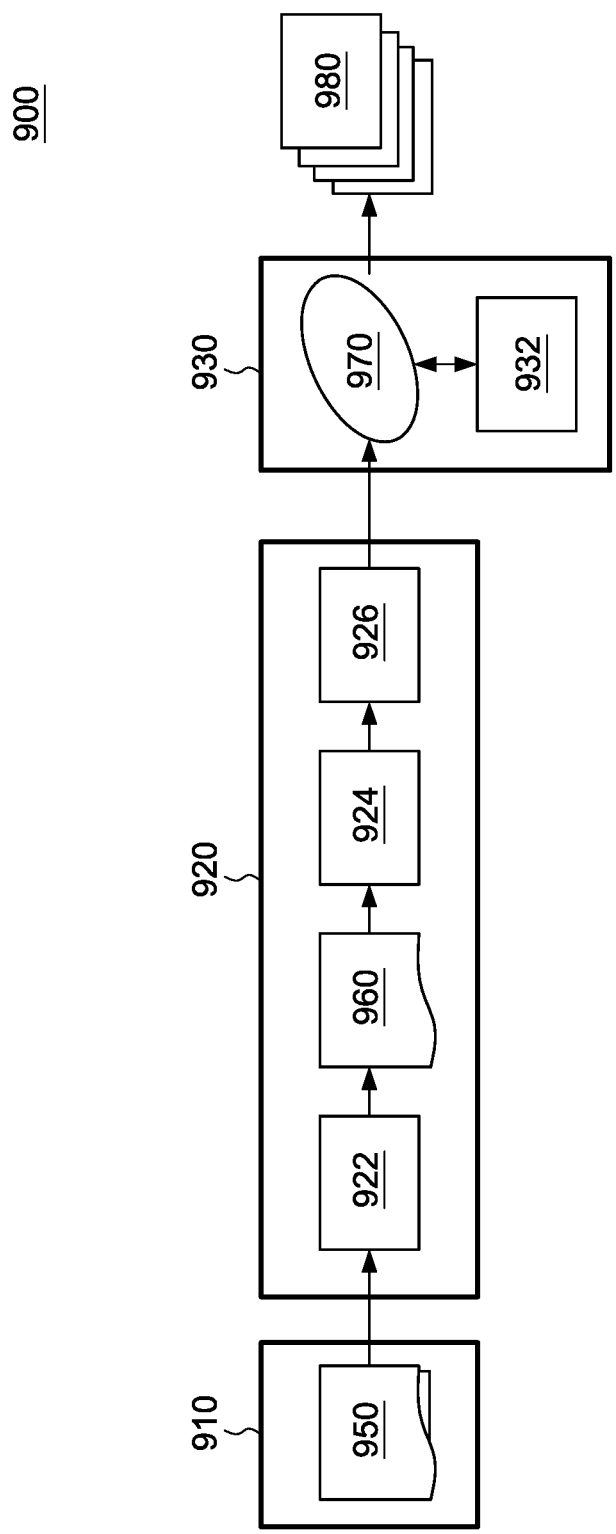
FIG. 9A is a schematic diagram showing an integrated circuit (IC) manufacturing system, in accordance with some embodiments.

FIG. 9A is a schematic diagram 900 showing an integrated circuit (IC) manufacturing system, in accordance with some embodiments. The IC manufacturing system 900 is configured to manufacture an IC device 980 through a plurality of entities, such as a design subsystem 910, a mask subsystem 920, and a fabrication subsystem 930. The entities in the IC manufacturing system 900 may be linked by a communication channel, e.g., a wired or wireless channel, and interact with one another through a network, e.g., an intranet or the internet. In an embodiment, the design subsystem 910, the mask subsystem 920 and the fabrication subsystem 930 belong to a single entity, or are operated by independent parties.

The design subsystem (design house or layout design provider) 910 generates a design layout 950 in a design phase for the IC devices 980 to be fabricated. The design subsystem 910 may perform the layout methods discussed in the present disclosure to generate the design layout 950, e.g., the design layouts shown with reference to the figures of the present disclosure. In an embodiment, the design subsystem 910 operates a circuit design procedure to generate the design layout 950. The design subsystem 910 may include further one or more steps, such as logic design, physical design, pre-layout simulation, placement and routing, timing analysis, parameter extraction, design rule check and post-layout simulation, to generate the design layout 950. The design layout 950 may be converted from description texts into their visual equivalents to show a physical layout of the depicted patterns, such as the dimensions, shapes and locations thereof. In an embodiment, the design layout 950 can be expressed in a suitable file format such as GDSII, DFII, OASIS, or the like.

The mask subsystem 920 receives the design layout 950 from the design subsystem 910 and manufactures one or more masks (photomask, lithography masks or reticles) according to the design layout 950. In an embodiment, the mask subsystem 920 includes a mask data preparation block 922, a mask fabrication block 924 and a mask inspection block 926. The mask data preparation block 922 modifies the design layout 950 so that a revised design layout 960 can allow a mask writer to transfer the design layout 950 to a writer-readable format.

The mask fabrication block 924 is configured to fabricate the mask by preparing a substrate based on the design layout 960 provided by the mask data preparation block 922. A mask substrate is exposed to a radiation beam, such as an electron beam, based on the pattern of the design layout 960 in a writing operation, which may be followed by an etching operation to leave behind the patterns corresponding to the design layout 960. In an embodiment, the mask fabrication block 924 includes a checking procedure to ensure that the layout data 960 complies with requirements of a mask writer and/or a mask manufacturer to generate the mask as desired. An electron-beam (e-beam), multiple e-beams, an ion beam, a laser beam or other suitable writer source may be used to transfer the patterns.

After the lithography mask is fabricated, the mask inspection block 926 inspects the fabricated mask to determine if any defects, such as full-height and non-full-height defects, exist in the fabricated mask. If any defects are detected, the mask may be cleaned or the design layout in the mask may be modified.

The fabrication subsystem 930 is an IC manufacturing entity that includes multiple manufacturing facilities or tools for the fabrication of a variety of the IC devices 980. The fabrication subsystem 930 uses the mask fabricated by the mask subsystem 920 to fabricate a wafer 970 having a plurality of IC devices 980 thereon. The wafer 970 includes a semiconductor substrate and optionally various layers formed thereon. The operations provided by the manufacturing facilities or tools may include, but not limited to, photolithography, deposition, sputtering, etching, diffusion, ion implantation and annealing. In some embodiments, test structures may be formed on the wafer 970 to generate test data indicative of the quality of the fabricated wafer 970. In an embodiment, the fabrication subsystem 930 includes a wafer testing block 932 configured to ensure that the wafer 970 conforms to physical manufacturing specifications and mechanical and/or electrical performance specifications. After the wafer 970 passes the testing procedure performed by the wafer testing block 932, the wafer 970 may be diced (or sliced) along the scribe line regions to form separate IC devices 980. The dicing process can be accomplished by scribing and breaking, by mechanical sawing (e.g., with a dicing saw) or by laser cutting.

Figure 9B:
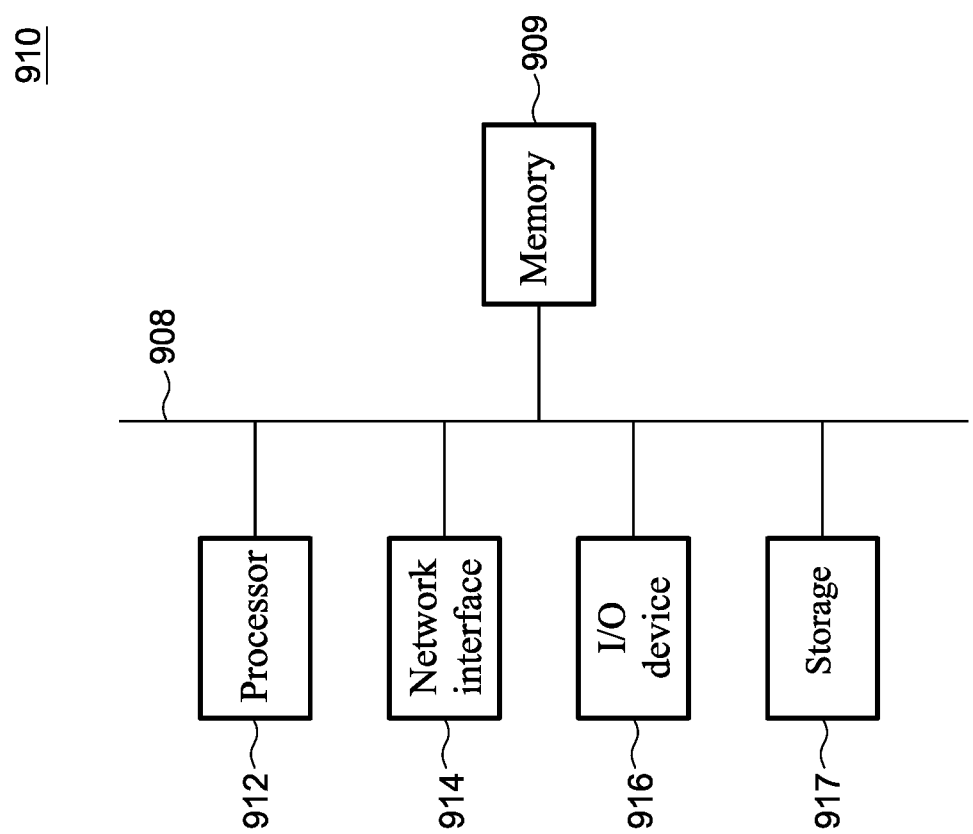
FIG. 9B is a schematic diagram of a design subsystem in the IC manufacturing system shown in FIG. 9A for generating a design layout, in accordance with some embodiments.

FIG. 9B is a schematic diagram of the design subsystem 910 in the IC manufacturing system 900 shown in FIG. 9A for generating or storing the design layouts discussed above, in accordance with some embodiments. In some embodiments, the design subsystem 910 is a computer system. The design subsystem 910 includes a processor 912, a network interface 914, an input and output (I/O) device 916, a storage device 917, a memory 909, and a bus 908. The bus 908 couples the network interface 914, the I/O device 916, the storage device 917, the memory 909 and the processor 912 to each other.

The processor 912 is configured to execute program instructions that include a tool configured to generate the design layouts as described and illustrated with reference to figures of the present disclosure.

The network interface 914 is configured to access program instructions and data accessed by the program instructions stored remotely through a network (not shown).

The I/O device 916 includes an input device and an output device configured for enabling user interaction with the system 910. In some embodiments, the input device includes, for example, a keyboard, a mouse, and other devices. Moreover, the output device includes, for example, a display, a printer, and other devices.

The storage device 917 is configured for storing the design layouts, program instructions and data accessed by the program instructions. In some embodiments, the storage device 917 includes a non-transitory computer-readable storage medium, for example, a magnetic disk and an optical disk.

The memory 909 is configured to store program instructions to be executed by the processor 912 and data accessed by the program instructions. In some embodiments, the memory 909 includes any combination of a random access memory (RAM), some other volatile storage device, a read-only memory (ROM), and some other non-volatile storage device.

According to an embodiment, a memory array is provided. The memory array includes a plurality of memory elements, a plurality of selectors and a plurality of first conductive vias. In some embodiments, the plurality of selectors are configured to access the plurality of memory elements. In some embodiments, each of the plurality of selectors includes two pairs of fin structures and a gate structure. In some embodiments, the two pairs of fin structures extend in a first direction. In some embodiments, the gate structure extends in a second direction perpendicular to the first direction and crosses the two pairs of fin structures.

In some embodiments, the plurality of first conductive vias are electrically coupled to the two pairs of fin structures of the plurality of selectors.

According to an embodiment, a memory array is provided. The memory array includes a plurality of memory elements, a plurality of selectors and a plurality of conductive vias. In some embodiments, the plurality of selectors are configured to access the respective plurality of memory elements. In some embodiments, each of the plurality of selectors includes two pairs of fin structures and a gate structure. In some embodiments, the two pairs of fin structures extend in a first direction. In some embodiments, the gate structure extends in a second direction perpendicular to the first direction, crosses the two pairs of fin structures and defines two pairs of channel regions with the two pairs of fin structures. In some embodiments, the plurality of conductive vias are arranged at corners of the plurality of selectors and are electrically coupled to the two pairs of fin structures of the plurality of selectors.

According to an embodiment, a method for forming a memory array is provided. The method includes the following operations. A plurality of selectors are provided. In some embodiments, the providing the plurality of selectors includes forming two pairs of fin structures extending in a first direction. In some embodiments, the providing the plurality of selectors further includes forming a gate structure extending in a second direction perpendicular to the first direction and crossing the two pairs of fin structures. A plurality of memory elements are provided and electrically coupled to the plurality of selectors. A plurality of conductive vias are provided and electrically coupled to the two pairs of fin structures of the plurality of selectors. In some embodiments, the plurality of conductive vias are staggered.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
a plurality of memory elements;
a plurality of selectors configured to access the plurality of memory elements, wherein each of the plurality of selectors comprises:
two pairs of fin structures extending in a first direction; and
a gate structure extending in a second direction perpendicular to the first direction and crossing the two pairs of fin structures; and
a plurality of first conductive vias electrically coupled to the two pairs of fin structures of the plurality of selectors,
wherein the plurality of first conductive vias form a staggered pattern in the first direction.

2. The memory array according to claim 1, further comprises first and second active regions, wherein the two pairs of fin structures are disposed in the first and second active regions, respectively.

3. The memory array according to claim 1, wherein each of the plurality of memory elements comprises a free layer, a reference layer and a tunnel barrier layer between the free layer and the reference layer.

4. The memory array according to claim 1, wherein each of the plurality of selectors further comprises a conductive line layer extending in the second direction and electrically connecting the two pairs of fin structures.

5. The memory array according to claim 1, wherein the plurality of first conductive vias electrically connect the plurality of selectors to the plurality of memory elements, respectively.

6. The memory array according to claim 1, wherein the two pairs of fin structures includes a pair of first fin structures and a pair of second fin structures, a first subset of the plurality of first conductive vias overlapping the pair of first fin structures from a top view, and a second subset of the plurality of first conductive vias overlapping the pair of second fin structures from the top view.

7. The memory array according to claim 6, wherein a spacing between the two pairs of fin structures is greater than a spacing between the first fin structures or between the second fin structures.

8. The memory array according to claim 6, wherein the first subset of the plurality of first conductive vias and the second subset of the plurality of first conductive vias form the staggered pattern in the first direction.

9. The memory array according to claim 1, wherein a ratio of a length of the two pairs of fin structures in the first direction to a length of the gate structure in the second direction is substantially less than about ½.

10. The memory array according to claim 1, further comprising:
a plurality of second conductive vias arranged on boundary lines between the plurality of selectors.

11. The memory array according to claim 10, wherein the plurality of second conductive vias are electrically coupled to the plurality of selectors.

12. The memory array according to claim 10, further comprising a common source line extending along the boundary lines between the selectors and electrically connected to the plurality of second conductive vias.

13. A memory array, comprising:
a plurality of memory elements; and
a plurality of selectors configured to access the respective plurality of memory elements, wherein each of the plurality of selectors comprises:
two pairs of fin structures extending in a first direction; and
a gate structure extending in a second direction perpendicular to the first direction,
crossing the two pairs of fin structures and defining two pairs of channel regions with the two pairs of fin structures; and
a plurality of conductive vias arranged at corners of the plurality of selectors and electrically coupled to the two pairs of fin structures of the plurality of selectors.

14. The memory array according to claim 13, further comprising:
a common source line extending in the first direction and electrically coupled to the conductive vias.

15. The memory array according to claim 13, wherein each of the plurality of selectors further comprises a conductive line layer electrically connecting the two pairs of fin structures.

16. The memory array according to claim 15, wherein the plurality of conductive vias is electrically connected to the conductive line layer.

17. The memory array according to claim 13, wherein each of the plurality of memory elements comprises a free layer, a reference layer and a tunnel barrier layer over one another between the free layer and the reference layer.

18. A method for forming a memory array, comprising:
providing a plurality of selectors, wherein the providing the plurality of selectors comprises:
forming two pairs of fin structures extending in a first direction in each of the plurality of selectors; and
forming a gate structure extending in a second direction perpendicular to the first direction and crossing the two pairs of fin structures;
providing a plurality of memory elements electrically coupled to the plurality of selectors; and
providing a plurality of conductive vias electrically coupled to the two pairs of fin structures in each of the plurality of selectors, wherein the plurality of conductive vias are staggered.

19. The method according to claim 18, wherein the providing the plurality of selectors further comprises forming first and second active regions, wherein the two pairs of fin structures are formed in the first and second active regions, respectively.

20. The method according to claim 18, wherein the providing the plurality of selectors further comprises providing a conductive line over and electrically coupled to the two pairs of fin structures.

* * * * *